US006627372B1

(12) United States Patent
Steinhauer et al.

(10) Patent No.: US 6,627,372 B1
(45) Date of Patent: Sep. 30, 2003

(54) COLOR MIXING SYSTEM

(75) Inventors: Jeffrey Steinhauer, Rehovot (IL); Michael Shuster, Tel-Aviv (IL); Benzion Landa, Nes-Ziona (IL); Eli Kritchman, Tel-Aviv (IL)

(73) Assignee: Hewlett-Packard Indigo B.V., Maastricht (NL)

( * ) Notice: Subject to any disclaimer, the term of this patent is extended or adjusted under 35 U.S.C. 154(b) by 0 days.

(21) Appl. No.: 09/937,806

(22) PCT Filed: Mar. 28, 1999

(86) PCT No.: PCT/IL99/00178

§ 371 (c)(1), (2), (4) Date: Sep. 26, 2001

(87) PCT Pub. No.: WO00/58791

PCT Pub. Date: Oct. 5, 2000

(51) Int. Cl.[7] .......................... G03G 13/01; G03F 3/08

(52) U.S. Cl. .................................. 430/137.1; 358/520

(58) Field of Search ..................... 430/137.1; 358/520, 358/504; 382/165, 167

(56) References Cited

U.S. PATENT DOCUMENTS

| | | | | |
|---|---|---|---|---|
| 5,754,184 A | | 5/1998 | Ring et al. | |
| 5,790,261 A | * | 8/1998 | Hayashi et al. | 358/296 |
| 5,838,465 A | | 11/1998 | Seino et al. | |
| 6,162,573 A | * | 12/2000 | Grande et al. | 430/137 |

FOREIGN PATENT DOCUMENTS

| | | |
|---|---|---|
| EP | 0 620 505 | 10/1994 |
| EP | 0 833 218 | 4/1998 |
| WO | WO 99/45433 | 9/1999 |

* cited by examiner

*Primary Examiner*—John Goodrow
(74) *Attorney, Agent, or Firm*—Fenster & Company

(57) ABSTRACT

A method of proportions of toner particles of different colors to be used in a mixture for toning an electrostatic image, the method comprising:

determining a desired color for viewing;

determining an illumination under which the desired color is to be viewed;

determining a target color for printing which results in the desired color being perceived under the illumination;

determining a plurality of sets each consisting of only two available candidate toner particles and optionally black and/or transparent color particles;

computing a mixture of toner particles of a set of candidate color to particles only from said plurality of sets that best matches target color, according to a predetermined criteria; and mixing the colored toner particles to form a toner for printing.

19 Claims, 2 Drawing Sheets

COLOR MIXING SYSTEM

RELATED APPLICATIONS

The present application is a US national application of PCT/IL99/00178, filed Mar. 28, 1999.

The present invention is related to the field of printing and in particular to providing toners with non-standard colors.

BACKGROUND OF THE INVENTION

Most printing systems are based on actual printing of only a limited number of different standard colored inks. In general, these inks are chosen such that a wide apparent range of colors may be achieved by so called "half tone" processes. In half tone printing, the color is achieved by overlaying partial printed areas of the various standard colors. The percentage of the respective areas printed by the standard colors is chosen such that, to the eye of viewer, the desired color is achieved. In general, cyan, magenta and yellow, optionally together with black are the standard colors, with some systems adding additional colors, such as one or more of green, orange and purple.

It is known to mix colored inks to achieve similar effects. This is sometimes desirable when large areas are to be printed in a given color, since the quality of printing with a single ink is generally better than with half-tones. A custom ink may be mixed from the standard inks by (1) determining the proportions of the standard inks required to achieve the color; (2) determining the thickness of ink in an area printed with the proportions of the colors; (3) comparing the thickness with a desired thickness; and (4) mixing the proportions of the standard colors and a transparent ink and/or adjusting the printing to achieve the desired color, preferably with the desired thickness.

Standard systems have been developed by which a wide range of colors can be achieved by mixing standard colors. Some of these systems are based on color charts. Others are based on computer programs that define the percentages of different standard colored inks (including black and transparent) that should be mixed to achieve a desired color.

It is also known that an approximation of the desired color can be achieved, in a half tone printing process, utilizing only two colors and black. In some systems five or six colors (plus black) are provided. A desired color is provided by half toning utilizing only the two nearest standard colors which form a segment in L*H*C* space and black. This two color process is described for example in co-pending PCT patent application PCT/IL98/00101, filed Mar. 2, 1998 and entitled "Expanded Color Space", the disclosure of which is incorporated herein by reference. In general such printing results in colors which match the desired color only in a particular lighting situation and deviate from it somewhat in other lighting.

When toners are used for printing, mixing colors is generally impractical. In particular, if toner particles of various colors are mixed together and used for printing, the rate of depletion of the different colors will be different, probably at least because the mobility of the particles is somewhat different. Thus, with use, the color of the toner (and thus of the printed surface) will change as the uneven depletion of the different components of the mix takes place.

SUMMARY OF THE INVENTION

One aspect of some preferred embodiments of the invention is concerned with mixing toners of different colors to achieve a mixture which stably prints a target color despite uneven depletion of the components of the mixture.

In a preferred embodiment of the invention, according to this aspect, only two colors of toner particles, plus black and transparent are used to form the mixture. Most preferably, the two colors are colors that are nearby the target color. It has been found that the color achieved when printing with such mixtures is more stable than when a greater number of color components or non nearby colors are used. While it is more desirable to use a greater number of colors in the mixture to achieve better color fidelity, acceptable fidelity, at least under a given lighting condition, can be achieved with only two colors.

In a preferred embodiment of the invention, according to this aspect, color matching is made to a color which is the combination of the color spectra of the actual target color and that of a desired viewing illumination. In a preferred embodiment of the invention, the desired illumination is chosen from a plurality of different illuminations, by an operator and a spectrum of the target color, as viewed in the desired illumination, is computed. This specimen defines what will be referred to herein as an "illumination adjusted color." The two colors are chosen from a group of standard colors.

These two colors are preferably those which form a segment of minimum size in an HC space, in which segment the target illumination adjusted color is contained. Such colors are referred to herein as "nearby colors." The proportions of the two colors and black and the thickness of printed required to achieve a best match to the illumination adjusted color are computed. To the extent that this thickness is less than the standard thickness or range of thickness achieved by a printer on which the ink will be used, a proportion of transparent ink is computed, such that the printed color (with the requisite thickness) will have the desired hue and saturation.

It should be noted that it is believed that this aspect of the invention is also applicable to mixing utilizing more than two toner colors.

In preferred embodiments of the invention, additional factors are taken into account in determining the color mix. These may include, the coloration of the paper or other substrate on which the color is to be printed, the difference between the proportions of toner in mixture and on the developed image and the difference between the proportions of toner left on the developed paper after metering of the developed image.

There is thus provided, in accordance with a preferred embodiment of the invention a method of determining proportions of toner particles of different colors to be used in a mixture for toning an electrostatic image, the method comprising:

- determining a target color for matching;
- determining at least one set of candidate colored toner particles;
- computing a mixture of toner particles of the at least one set of candidate color toner particles that best matches target color, and
- mixing the colored toner particles to form a toner for printing.

In a preferred embodiment of the invention, determining a target color comprises:

- determining a target color,
- determining an illumination under which the color is to be viewed;

determining the target color for matching as the apparent color of the target color under the illumination.

Alternatively, determining a target color comprises:

determining a target color;

determining an illumination under which the color is to be viewed;

determining a color of a substrate on which the target color is to be printed; and determining the target color for matching as the apparent color of the target color, printed on the substrate, under the illumination.

Preferably, determining the color of a substrate comprises choosing a substrate type from a plurality of substrate types.

In a preferred embodiment of the invention, determining an illumination comprises choosing an illumination from a plurality of illumination types.

In a preferred embodiment of the invention, determining at least one set of candidate color particles comprises choosing two types of particles both of which are different from black and transparent. Preferably, determining the at least one set of candidate color particles comprises choosing said particles from a plurality of available color toner particles.

Preferably,determining the at least one set of candidate color particles comprises choosing the pair of colored toner particles in said plurality of available color toner particles, which pair comprises colors which are closest to the target color.

In an alternative preferred embodiment of the invention, determining the at least one set of candidate color particles comprises choosing a plurality of pairs of said particles. In a preferred embodiment of the invention determining the at least one set of candidate color toner particles comprises choosing all pairs of available color particles.

In a preferred embodiment of the invention, the method includes:

determining a best match proportionate mixture for each set of color pairs which best matches the target color; and choosing the color pair and proportions having the best match to the target color.

Preferably, when more than one color pair have the same best match, the pair having the closest colors is chosen.

In a preferred embodiment of the invention, computing a mixture of toner particles comprises comparing the target color to a calculated printed color of the color toner mixture under the conditions under which it is to be viewed.

Preferably, the method includes:

correcting the mixture of toner particles to be mixed, responsive to the relative transfer proportions of the toner particles to the electrostatic image during development of the image.

In a preferred embodiment of the invention the method includes mixing black and transparent toner particles with the colored toner particles to form a better color match between the target and a color printed with the mixture.

In a preferred embodiment of the invention, the toner particles are provided in separate liquid toner dispersions of toner particles in carrier liquid and mixing the toner particles comprises mixing the liquid toner dispersions.

In a preferred embodiment of the invention the method includes correcting the mixture of toner particles to be mixed, responsive to the proportion of toner particles of different types removed from a developed image during processing of the image.

There is further provided, in accordance with a preferred embodiment of the invention, a toner comprising a mixture of toner particles produced according to the invention.

There is further provided, in accordance with a preferred embodiment of the invention, a method of printing comprising:

providing an electrostatic printing apparatus; and printing images in the apparatus utilizing toner according to the invention.

In a preferred embodiment of the invention, the method includes adjusting the thickness of the printed image in order to provide a better match to the target color.

BRIEF DESCRIPTION OF THE DRAWINGS

The present invention will be more clearly understood from the following description of the preferred embodiments thereof, taken together with the following drawings, in which.

DETAILED DESCRIPTION OF PREFERRED EMBODIMENTS OF THE INVENTION

Figure 1:
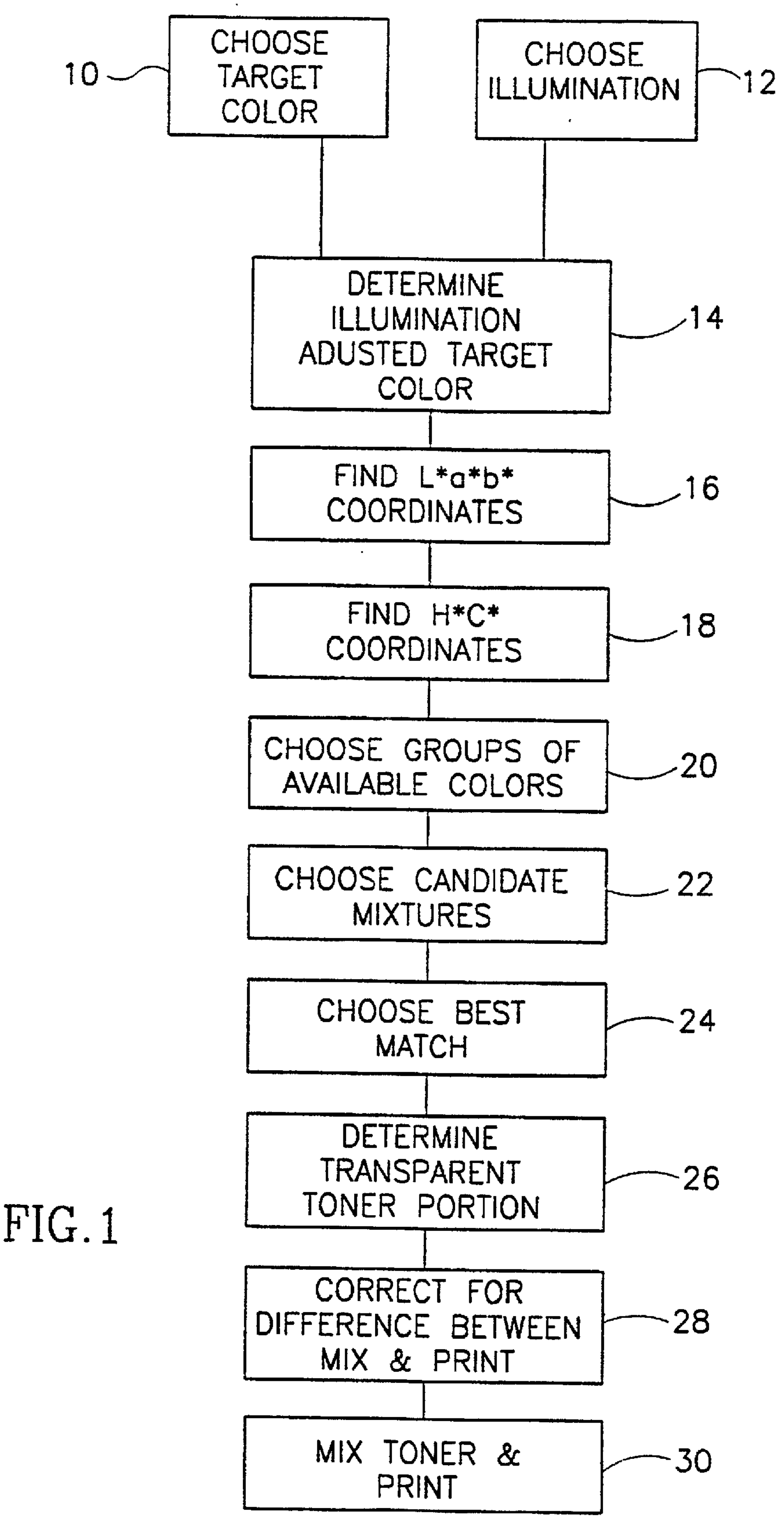
FIG. 1 is a simplified flow diagram of a method of providing custom ink mixtures, in accordance with a preferred embodiment of the invention.

FIG. 1 illustrates a method of determining the amounts of various colors of ink to be used in mixing a custom ink, in accordance with a preferred embodiment of the invention.

Preferably, the process starts with the selection by a user of a desired target color (10) and a desired illumination (12).

The target color may be chosen in one of a number of ways. One way to choose the target color is to scan a sample of the color and determine its spectrum. Another way is to choose a color from a color chart. Preferably, a computer, which carries out the calculation and determinations described below, will have spectra of these color chart colors in a memory. A third method would be to define the half-tone printed proportions for the color or other color component breakdown of the color. Yet another way is to utilize the values of three color parameters (for example L*a*b*) received with the color.

The illumination could be defined by defining a particular standard illumination from a catalog of such illuminations. Such illuminations would typically include at least some of daylight, fluorescent lighting, incandescent lighting, and other lighting sources as are well known. The computer preferably has spectra of these sources stored in a memory.

Alternatively, the light source may be specified by its spectrum. Alternatively, the light source itself may be provided and measured to determine its spectrum.

The next step in the process is, preferably, the determination of the illumination adjusted color spectrum (14). This color spectrum is the basis for the rest of the process. The color coordinates of the illumination adjusted color spectrum are found next (16).

In a preferred embodiment of the invention, the color coordinates are first determined in L*a*b* space and then these coordinates are used to determine the two coordinates H*C* in an L*H*C* space determined by A*B* (18). These are both standard processes, and are well known in the art. In other preferred embodiments of the invention, other color coordinate systems may be used and other paths to determining the color coordinates may be used.

In a preferred embodiment of the invention, in the next step (20), groups of available colors (from a plurality of such available colors) are chosen as candidates for providing the mix. Each said group preferably consists of two adjoining colors in the color space. An attempt is made to match, to the extent possible, the target color to a printed mixture of colors as printed on the particular substrate and as viewed in the desired illumination. Such computations are well known in the art and they are, in fact the same as those used in determining the proportions of the areas to be printed, in half-tone printing, to achieve the target color. The L*a*b* of the printed mixture is compared to that of the adjusted target color spectra and a difference is determined. The best match for a particular pair of toner colors is chosen as a candidate mixture (22).

The candidate mixtures are compared and the pair of colors which gives the best match between the target and printed colors is chosen as the basis for determining the mixture of the 153 toners (24). This automatically results in the use of the two nearby colors.

Alternatively, candidate mixtures are computed for all of the possible pairs of colors and not just for the nearby pairs. The color differences between the adjusted target colors and the printed colors (for example in L*a*b* space) are computed and the mixture with the smallest difference is chosen. In the event that more than one pair has a minimum value, the closeness of the colors in these pairs is determined and the closest pair of colors is chosen. Preferably, this determination of closeness is made taking into consideration illumination and substrate coloration. This situation may arise for example, where more than one pair provides an exact color match.

The present inventor(s) has(have) found that when illumination adjusted spectra are used, the fidelity of the printed color, under the chosen illumination conditions is improved. This is especially true when only two colors plus black are used to form the ink. Furthermore, it has been found that for charged toner, and especially for liquid toner, in which the different color particles deplete at different rates, the color remains closer to the desired color when two colors are used than when the color is matched more precisely with a greater number of colors. It has been found that achieving greater fidelity by using a greater number of colors results in the fidelity balance being much more sensitive to the exact mix of colors being maintained.

After the proportions of the colors and black have been determined, the total amount of toner or ink particles per unit area required to provide the desired color saturation is determined. In general, the relative saturation information is stored in the computer as a thickness of ink required or as a percent surface coverage required as a function of saturation. In general, printers are set to print at a fixed ink thickness. If the total ink thickness required by the components, for the desired saturation, is less than the desired total ink thickness, then an additional amount of transparent ink is specified as part of the mixture (26). It should be noted that the term transparent ink is used to denote colorless toner, including colorless particles, such as toner particles.

If the total required thickness is greater than the thickness delivered by the printer, then an ink or toner mixture cannot be specified, without either changing the printed thickness or deviating from the desired target color.

It might be thought that the thicknesses determined in step 26 should be the proportions of the toner mixture. However, in accordance with a preferred embodiment of the invention, an additional factor (28) is taken into account. This factor is the different mobilities of the toner particles (or the relative depletion rates) for the toner particle components. This difference in mobilities causes a compound effect. The first part of this compound effect is that the different mobilities cause different proportions of toner particles to be deposited in the development process. These different proportions must be taken into account, by increasing the proportion of less mobile toner particles in the mixture.

Moreover, these particles are not uniformly distributed in the developed layer of toner.

In particular, the more mobile toner particles are closer (on the average) to the photoreceptor than the less mobile toner particles. In many liquid toner systems, the outer, less dense, layers of the developed layer are removed by a process known as metering. This reduces even further the amount of less mobile toner that must be added to the mixture.

It might be thought that this difference between the proportions of toner in the mixture and the amount of toner in the printed image might cause an ever deteriorating match between the target and actual colors. However, this problem is mitigated, so long as the metered toner particles are discarded, for the following reason. As printing continues, the proportion of the more mobile particles in the mix decreases. However, these particles are more dense near the photoreceptor, such that their proportion in the image after metering changes more slowly than their proportion in the toner. The differences in the proportions of the toner particles which develops is preferably corrected when the toner is replenished, by utilizing a replenishment toner concentrate having a greater proportion of the mobile toner particles.

All that remains, is to mix the colored inks or toners in the specified proportions and print (30).

It should be noted that while the invention has been described in the context of determining the color components of a custom ink mixture with two colors, the method is also generally applicable to both two colors and a greater number of colors.

Figure 2:
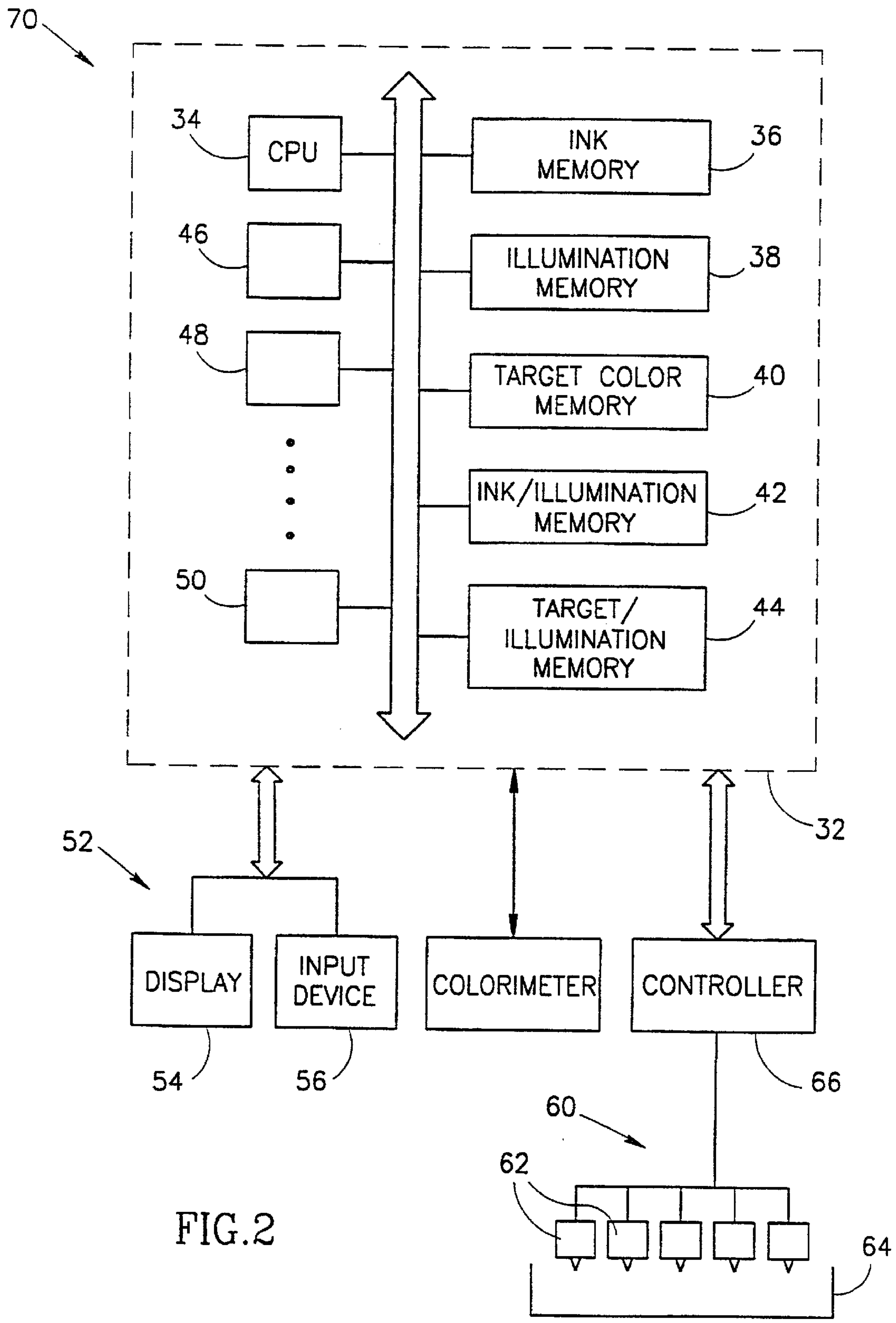
FIG. 2 shows a simplified schematic drawing of a system for determining color mixing, in accordance with a preferred embodiment of the invention.

FIG. 2 shows a simplified schematic drawing of a system 70, for determining color mixing, in accordance with a preferred embodiment of the invention.

System 70 includes a computer 32 having a computation unit 34, an ink memory 36 for spectra or other color information regarding an available set of colored inks or toners and an illumination memory 38 for holding information regarding the spectra (or other color information) of a plurality of illumination sources. Optionally, computer 32 includes a target color memory 40 in which color information regarding a number of colors is stored. Alternatively or additionally, the computer may optionally include one or more of a memory 42 for storage of precalculated color characteristics for combinations of illumination and ink and/or substrate or toner spectra and/or a memory 44 in which precalculated color characteristics for illumination and target colors is stored.

In addition, in a preferred embodiment of the invention, the computer includes a series of memories designated by the reference numerals 46–50 (although any number of memories may be present) which temporarily hold information regarding one or more of the spectrum (or other color information) regarding the target color, the desired illumination source, the colors to be mixed to achieve the target color and information concerning the illumination adjusted target color and the illumination adjusted colors of the inks or combinations of the inks.

In one preferred embodiment of the invention, a bus or buses 51 is used to transfer data and commands within the computer and possibly to and from peripherals described below. Alternatively an interface is provided for each of the inputs and outputs to computer 32.

In operation, according to one preferred embodiment of the invention, the desired color is inputted to computer 32 via a user interface 52. User interface 52 preferably includes a display 54, which displays choices available to the user or mixing or other information for the user. Preferably, interface 52 also includes a keyboard 56 or other device for inputting user choices or other user information, as indicated below.

In a preferred embodiment of the invention, system 30 also includes a colorimeter 58 which receives a sample of a color, as for example from a color card or from a printed sheet or photograph and determines the spectrum of the color. The spectrum information is then transferred to one of memories 46–50 and/or to memory 40.

In a preferred embodiment of the invention, the user is asked to choose from a saved target color or to input a particular color via calorimeter 58. He is also preferably asked to input a desired illumination. This desired illumination is generally specified from one of the illuminations whose characteristics are stored in memory 38, although it is possible to input a particular illumination by illuminating a sheet of white paper with the illumination and determining the spectrum of the reflected light using colorimeter 58.

Similarly, the color or type of substrate to be used is inputted by the user and spectral information regarding the reflectivity of the paper is stored in a memory. This spectral information may be pre-stored or may be inputted based on measurements made with calorimeter 58.

Once a target color, a target illumination and a substrate are chosen, arithmetic unit 34 computes the percentages of colored inks or toners required for the custom ink. This calculation is preferably performed utilizing the method described above in conjunction with FIG. 1 or the variations on that method described above. Alternatively, any method used to calculate color components from a given color may be used, based on the illumination adjusted color of the target and or the inks.

In a preferred embodiment of the invention, the display lists the proportions of the inks to be used in the mixture. Alternatively or additionally, an automatic mixer 60 is used to supply various toner or ink colors from sources 62 to a mixing device 64 in which the ink or toner is mixed. In a preferred embodiment of the invention, the supply from sources 62 and the mixing is controlled by a controller 66 that receives mixing information from computer 32.

In an alternative preferred embodiment of the invention, computer 32 is used to supply color coverage information to a RIP device. In one possible configuration of this device, image color information is received from an image memory. For each pixel in the image, the computer calculates a percentage of coverage of the printed surface for each of the colors which are to be printed. This computation is performed taking into account at least one of (and preferably both of) the illumination adjusted color of the pixel and the illumination adjusted color of the inks used in forming the image. The printing may be constrained to use only some of the available colors for any particular pixel or that may be unconstrained, depending on the desired printing characteristics.

The present invention has been described in the context of a number of preferred embodiments and variations. It should be understood that the particular features of these embodiments may be combined in additional preferred embodiments of the invention and that some of the features may be omitted in some preferred embodiments of the invention with or without corresponding loss of finction.

The preferred embodiments of the invention are presented for illustrative purposes only and are not meant to limit the scope of the invention, which is only limited by the claims. The terms “comprise” or “include” or their conjugates, when used herein mean “including but not necessarily limited to.”

What is claimed is:

1. A method of determining proportions of toner particles of different colors to be used in a mixture for toning an electrostatic image, the method comprising:

determining a desired color for viewing;

determining an illumination under which the desired color is to be viewed;

determining a target color for printing which results in the desired color being perceived under the illumination;

determining a plurality of sets each consisting of only two available candidate toner particles and optionally black and/or transparent color particles;

computing a mixture of toner particles of a set of candidate color toner particles only from said plurality of sets that best matches target color, according to a predetermined criteria; and mixing the colored toner particles to form a toner for printing.

2. A method according to claim 1 and including:

determining a color of a substrate on which the target color is to be printed, wherein determining a target color for printing comprises determining a target color for printing which results in the desired color being perceived when printed on the substrate, under the illumination.

3. A method according to claim 2 wherein determining the color of a substrate comprises choosing a substrate type from a plurality of substrate types.

4. A method according to claim 1 wherein determining an illumination comprises choosing an illumination from a plurality of illumination types.

5. A method according to claim 1 wherein determining candidate color particles comprises choosing said particles from a plurality of available color toner particles.

6. A method according to claim 5 wherein determining the candidate color particles of at least some of the sets comprises choosing the pair of colored toner particles in said plurality of available color toner particles, which pair comprises colors which are closest to the target color.

7. A method according to claim 5 wherein determining the sets of candidate color toner particles comprises choosing all pairs of available color particles.

8. A method according to claim 7 and including:

determining a best match proportionate mixture for each set of color pairs which best matches the target color; and choosing the color pair and proportions having the best match to the target color.

9. A method according to claim 8 wherein, when more than one color pair have the same best match, the pair having the closest colors is chosen.

10. A method according to claim 1 wherein computing a mixture of toner particles comprises comparing the target color to a calculated printed color of the color toner mixture under the conditions under which it is to be viewed.

11. A method according to claim 1 and including:

correcting the mixture of toner particles to be mixed, responsive to the relative transfer proportions of the toner particles to the electrostatic image during development of the image.

12. A method according to claim 1 wherein the toner particles are provided in separate liquid toner dispersions of toner particles in carrier liquid and wherein mixing the toner particles comprises mixing the liquid toner dispersions.

13. A method according to claim 12 and including correcting the mixture of toner particles to be mixed, responsive to the proportion of toner particles of different types removed from a developed image during processing of the image.

14. A method of printing comprising:

providing an electrostatic printing apparatus; and printing images in the apparatus utilizing toner prepared according to claim 1.

15. A method according to claim 14 and including adjusting the thickness of the printed image in order to provide a better match to the target color.

16. A method according to claim 7 and including:

determining a best match proportionate mixture for each set of color pairs which best matches the target color; and choosing the color pair and proportions having the best match to the target color.

17. A method according to claim 16 wherein, when more than one color pair have the same best match, the pair having the closest colors is chosen.

18. A method according to any of claims 1–4, 5, 6, 7, 11, or 12–17 including mixing black and transparent toner particles with the colored toner particles to form a better color match between the target and a color printed with the mixture.

19. A method according to claim 1 wherein an amount of said transparent toner is added to provide a printed image having a desired color saturation when printed at a target thickness.

* * * * *